United States Patent [19]

Lamson

[11] Patent Number: 5,334,802
[45] Date of Patent: Aug. 2, 1994

[54] METHOD AND CONFIGURATION FOR REDUCING ELECTRICAL NOISE IN INTEGRATED CIRCUIT DEVICES

[75] Inventor: Michael A. Lamson, Van Alstyne, Tex.

[73] Assignee: Texas Instruments Incorporated, Dallas, Tex.

[21] Appl. No.: 86,277

[22] Filed: Jun. 30, 1993

Related U.S. Application Data

[63] Continuation of Ser. No. 939,188, Sep. 2, 1992.

[51] Int. Cl.$^5$ .......................................... H01L 23/28
[52] U.S. Cl. .................................. 174/52.2; 174/251; 361/813; 29/841; 257/787; 257/792
[58] Field of Search ................ 29/825, 827, 829, 841, 29/855–856; 174/52.2, 52.4, 250–251, 258; 361/765, 813; 257/690, 701–703, 787, 790–794

[56] References Cited

U.S. PATENT DOCUMENTS

| | | |
|---|---|---|
| 4,862,245 | 8/1989 | Pashby et al. |
| 4,916,519 | 4/1990 | Ward |
| 4,965,654 | 10/1990 | Karner et al. |
| 5,153,689 | 10/1992 | Okumura et al. |
| 5,197,184 | 3/1993 | Crumly et al. .................. 29/846 |

OTHER PUBLICATIONS

William C. Ward, IBM General Technology Division, Essex Junction, Vermont; "Volume Production of Unique Plastic Surface–Mount Modules for the IBM 80-ns 1-Mbit DRAM Chip by Area Wire Bond Techniques"; *IEEE, 0569-5503/88/0000-0552;* pp. 552–557.

*Primary Examiner*—Leo P. Picard
*Assistant Examiner*—Bot Ledynh
*Attorney, Agent, or Firm*—Robby T. Holland; Wade James Brady, III; Richard L. Donaldson

[57] ABSTRACT

A chip packaging configuration prevents differential electrical coupling within a plurality of associated bit lines (14 and 16) by associating, under lead frame (26), a first packaging material having a first dielectric constant and a second packaging material having a second dielectric constant and where the first packaging material and second packaging material are configured to expose the plurality of associated bit lines (14 and 16) to allow approximately equal coupling to lead frame (26) for each bit line (14 and 16) through the first and second dielectric constant to thereby prevent differential electrical coupling of the plurality of bit lines (14 and 16) with lead frame (26).

11 Claims, 1 Drawing Sheet

METHOD AND CONFIGURATION FOR REDUCING ELECTRICAL NOISE IN INTEGRATED CIRCUIT DEVICES

This application is a continuation of application Ser. No. 07/939,188, filed Sep. 2, 1992.

TECHNICAL FIELD OF THE INVENTION

The present invention relates to electronic device fabrication and more particularly to a method and configuration for eliminating electrical noise from vertical dielectric boundaries in numerous electronic device packaging configurations.

BACKGROUND OF THE INVENTION

As electronic devices become smaller, the need for innovative packaging configurations for semiconductor chips becomes increasingly important. Many of these configurations seek to minimize connections and lead space necessary for the connections. In doing this, these packaging configurations expose conductors or bit lines of the chip circuitry on or near the chip surface and beneath protective layers that cover the chip. The different chip packaging techniques that have bit lines at or near the chip surface include techniques known as "on-chip routing," "lead-over-chip" packaging, and "flip-chip" packaging. In all of the configurations resulting from these techniques, a surface covering often protects the exposed bit lines. The surface covering often is composed of two materials. One material may be a kapton or polyimide tape, and the other may be a bonding or molding compound.

In lead-over-chip packing, for example, a lead frame to the chip circuit may be placed over the surface covering and the bit lines. The lead frame and surface covering materials may adversely affect signals existing in bit lines beneath these materials. One way in which these surface materials may adversely affect signals in bit lines near the chip surface is by dielectrically coupling the electrical signals passing through the bit lines with the lead frame and the materials of the surface covering. If there are multiple bit lines near the surface of the electronic device and one of the surface covering materials affects certain of these bit lines more so than certain other bit lines, differential dielectric coupling may occur to adversely affect signals flowing through the bit lines. This phenomenon may be thought of as "differential dielectric coupling" of the various bit lines with the associated surface covering materials.

The lead-over-chip packaging technique provides an example to more clearly illustrate differential dielectric coupling of bit lines with surface covering materials. The dielectric constant of the polyimide tape may be approximately 3.5, while that of the molding compound may be approximately 5.0. Electrically coupled noise into the bit lines from the lead frame that is placed over the polyimide tape and the molding compound on the chip occurs if this vertical boundary falls between any differential bit line set. This is caused by the imbalance in capacitive coupling from the lead frame to each bit line through the different dielectric paths of the polyimide tape and molding compound.

The problem of differential dielectric coupling becomes even more serious when packaging material fabrication techniques become increasingly precise. As this occurs, boundaries between covering materials become more well-defined. If these more well-defined boundaries fall between bit lines, for example, between parallel bit lines on the semiconductor device surface, differential coupling can become an important source of electrical noise for signals passing through the bit lines.

As a result of the above, there is a need for a method to package an integrated circuit chip that reduces electrical noise from vertical dielectric boundaries in configurations where a conductor structure on the device appears near the chip surface.

There is a need for a method and configuration to eliminate electrical noise due to differential dielectric coupling from different packaging materials that form vertical dielectric boundaries in a variety of packaging techniques, including on-chip routing, lead-over-chip packaging, and flip-chip packaging.

There is a need for a method and configuration that eliminate electrically coupled noise due to differentially coupling bit lines with the lead frame and other chip surface materials that have different dielectric properties.

SUMMARY OF THE INVENTION

Accordingly, the present invention provides a method and configuration for reducing electrical noise from vertical dielectric boundaries in integrated circuit chip packaging configurations that avoid the limitations of existing circuit chip packaging methods.

In accordance with one aspect of the invention, there is provided a chip packaging configuration that prevents differential electrical coupling of chip packaging materials with a variety of associated bit lines that are beneath a conductive lead frame and that includes a first packaging material having a first dielectric constant and a second packaging material having a second dielectric constant. The first packaging material and the second packaging material associate to form a boundary that also associates with the plurality of bit lines. The boundary forms a configuration that exposes each of the plurality of bit lines to an average dielectric constant that approximates the average of the first dielectric constant and the second dielectric constant and, in so doing, prevents differential electrical coupling among the plurality of associated bit lines.

Another aspect of the present invention is a method for eliminating electrical noise from vertical dielectric boundaries in integrated circuit chip packaging that includes the steps of associating a first packaging material having a first dielectric constant with a plurality of associated bit lines and then associating a second packaging material having a second dielectric constant with the plurality of associated bit lines. The method further associates the first packaging material and the second packaging material to form a boundary that further associates with the plurality of associated bit lines so that each of the bit lines is exposed to a dielectric constant that approximates the average of the first dielectric constant and the second dielectric constant. This has the effect of preventing differential electrical coupling that often occurs due to predominantly associating the bit lines with either the first packaging material or the second packaging material.

A technical advantage of the present invention is that it promotes the use of packaging techniques that accommodate larger chips in smaller packages by permitting these packaging techniques to avoid differential electrical coupling of bit lines near the chip surface.

Another technical advantage of the present invention is that it provides a configuration that significantly reduces dielectric separation of different packaging materials that are placed between the lead frame and other elements of the integrated circuit chip and, thereby, avoids differential noise in the integrated circuits.

Another technical advantage of the present invention is that it avoids the problem of forming a dielectric boundary that occurs when a first and a second packaging material line up with bit lines on the chip. For example, the configuration of the preferred embodiment forms a zig-zag pattern that eliminates capacitive coupling between individual bit lines and dielectric materials that are the surface covering materials for an integrated circuit chip.

Another technical advantage of the present invention is that it reduces differential dielectric coupling in various packaging configurations including those resulting from lead-over-chip, on-chip routing, and flip-chip packaging techniques.

BRIEF DESCRIPTION OF THE DRAWINGS

The preferred embodiment of the present invention and its advantages are best understood by referring to FIGS. 1-5 of the drawings, like numerals being used for like and corresponding parts of the various drawings, and wherein.

DETAILED DESCRIPTION OF THE INVENTION

The preferred embodiment provides a packaging configuration for large DRAM and other types of chips where a lead frame is located over the chip surface and on a chip surface covering made of a kapton or polyimide tape that joins a molding compound. The juncture of the tape and molding compound forms a vertical dielectric boundary layer at the chip surface. Some chip types have bit lines that may run parallel with and directly under the vertical dielectric boundary. This may introduce electrical noise from the lead frame into the bit lines that run parallel to and directly beneath the vertical dielectric boundary. This is the case in DRAM chips using lead-over-chip packaging techniques where a material such kapton or polyimide is placed in a strip form along the length of the chip to form a vertical boundary with the molding compound at the chip surface. Differential electrically coupled noise comes from bit lines that are differentially coupled with the lead frame through the different surface covering materials. The result is an imbalance in impedance through the bit lines that may seriously affect signal flow and change signal values in the bit lines. The preferred embodiment addresses this problem.

Figure 1:
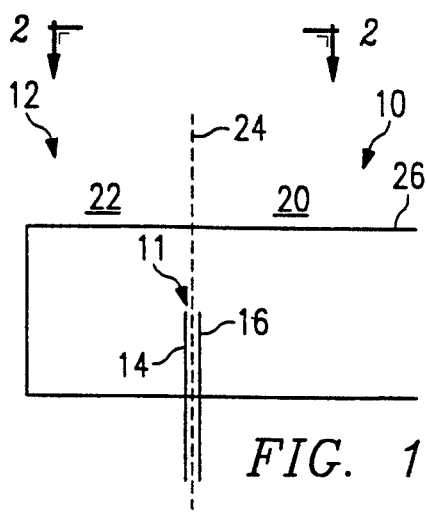
FIG. 1 provides a top view of a dielectric boundary over a bit line pair in an exemplary integrated circuit chip configuration.
Figure 2:
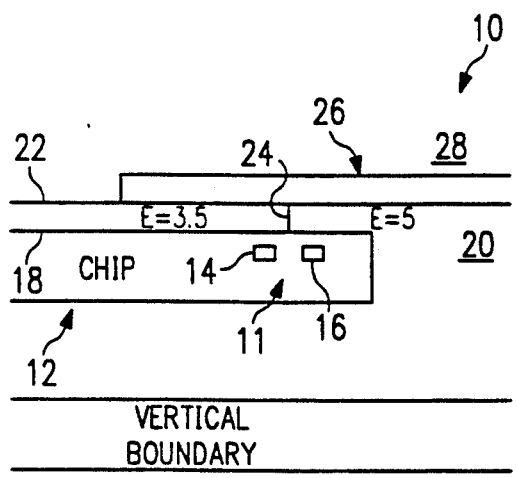
FIG. 2 shows a side view of a bit line pair configuration of FIG. 1 to illustrate the differential coupling that the preferred embodiment addresses.

To permit a full appreciation of the problem and to show the bit line configuration, FIGS. 1 and 2 are provided. FIG. 1 shows a top view of a dielectric boundary centered over a bit line pair, and FIG. 2 illustrates the configuration of FIG. 1 from a side view. Particularly, device 10 includes chip 12 using associated differential bit line pair 11 that includes line 14 and line 16 near surface 18 (FIG. 2) of chip 12. Over lines 14 and 16 appear mold compound 20 and kapton or polyimide tape 22. Molded compound 20 and tape 22 form vertical boundary 24. Lead frame 26 covers molding compound 20, tape 22, and vertical boundary 24. Covering lead frame 26 and tape 22 is additional molding compound 28.

In the configurations of FIGS. 1 and 2, electrical noise may be introduced into the signals that bit lines 14 and 16 carry. For example, lead frame 26 covers molding compound 20 over bit line 14. The typical dielectric constant for molding compound 20 may be 5.0, approximately. Similarly, lead frame 26 covers tape 22 over bit line 16. A typical dielectric constant for tape 22 may be 3.5, approximately. The arrangement over bit line 14 and the lead frame molding compound arrangement over bit line 16 may cause capacitive coupling. However, because of the different dielectric constants in tape 22 and molding compound 20, the degree of capacitive coupling of bit line 14 may be significantly different from that of bit line 16. This different capacitive coupling may introduce electrical noise into bit line pair 11 that bit lines 14 and 16 form.

Figure 3:
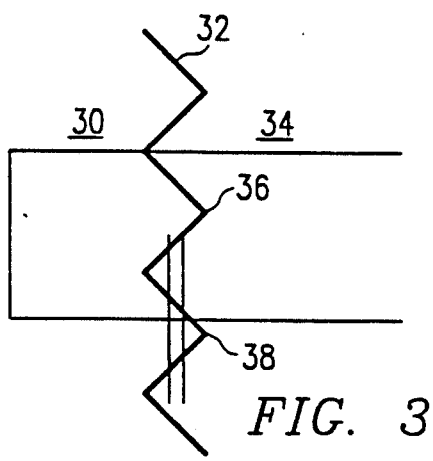
FIGS. 3 and 4 provide top views of the preferred embodiment including a zig-zag dielectric boundary over a bit line pair (FIG. 3) and, a plurality of bit lines (FIG. 4) in an integrated circuit chip to illustrate certain inventive concepts of the preferred embodiment.

In FIG. 3, the preferred embodiment illustrates that kapton or polyimide tape 30 may be configured to form vertical boundary 32 with molding compound 34. This is accomplished by forming the edge at tape 30 in a zig-zag pattern. Although the exact dimensions are not critical for the preferred embodiment, their relationships are important. For example, suppose that bit line 14 and bit line 16 each have an approximate length of 0.019 inches. With this length, it is preferable to use between peak 36 and peak 38 for example, a distance of 0.010 inches, or approximately one-half the length of bit lines 14 and 16. This assures that each bit line 14 and 16 in region 30 (i.e., dielectric constant=3.5) is capacitively coupled approximately equally to lead frame 26. Also, each bit line 14 and 16 in region 34 (i.e. dielectric constant= 5.0) is capacitively coupled approximately equally to lead frame 26. Since differential capacitive coupling between the bit line pairs 14 and 16 and the lead frame are equalized in this manner, the same amount of coupled noise is induced into each bit line from the lead frame. Since the bit lines operate in a differential mode, that is only the difference in voltage between the bit lines is significant, the coupled noise from the lead frame is eliminated.

Figure 5:
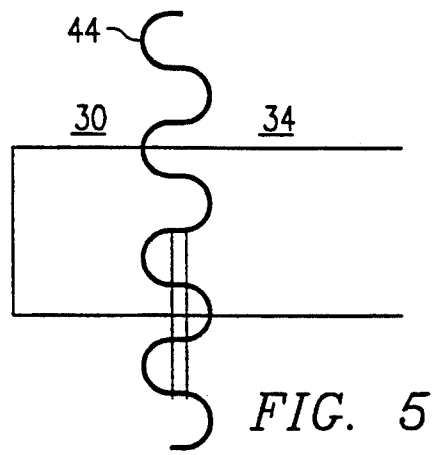
FIG. 5 provides an illustrative example of a possible vertical boundary configuration consistent with the concepts of the present invention.
Figure 4:
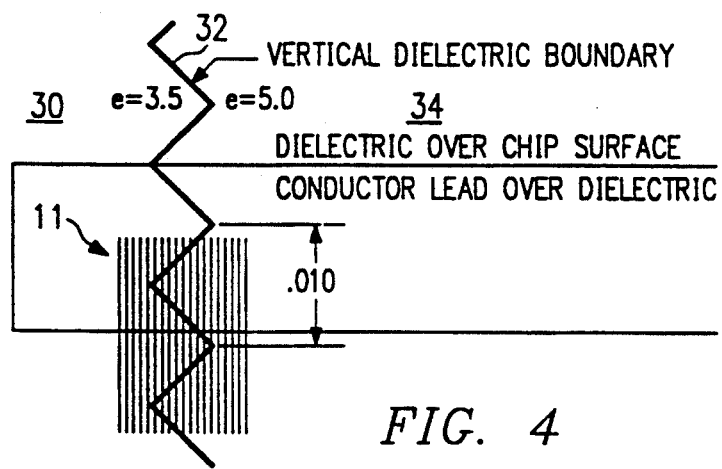

There are a numerous bit line pairs on a typical DRAM memory circuit chip. FIG. 4 shows the vertical zig-zag dielectric boundary in relation to a number of pairs. For each bit line pair, the objectives of avoiding a vertical boundary edge coincident with a bit line pair center line and providing equal coupling to the lead frame for each individual bit line are met. By not permitting dielectric boundary 32 to be parallel with bit lines 14 and 16, for example, the preferred embodiment effectively cancels the effects of the different dielectric constants of tape 30 and molding compound 34. This substantially eliminates the capacitive coupling problem of conventional packaging configurations. Specific packaging technologies that may use the preferred embodiment include lead-over-chip, on-chip routing, and flip-chip packaging techniques. FIG. 5 shows, for exemplary purposes, an alternative embodiment of the present invention as a tape layer showing a sinusoidal boundary 44. Boundary 44 also allows approximately equal coupling of the bit lines to the lead frame through the tape layer and molding compound.

In summary, there has been shown a chip packaging configuration that prevents differential electrical coupling of a plurality of associated bit lines with chip packaging materials beneath a lead frame, including a first packaging material having a first dielectric constant associated between the lead frame and the bit lines and a second packaging material having a second dielectric constant between the lead frame and associated with both the bit lines and with the first packaging material to form a boundary that associates with the plurality of bit lines to expose each of the plurality of bit lines to a dielectric constant that approximates the average of the first dielectric constant and the second dielectric constant. This significantly reduces differential electrical coupling within the plurality of bit lines.

Although the present invention and its advantages have been described in detail, this description is not meant to be construed in a limiting sense. It should be understood that various changes, substitutions, and alterations can be made herein without departing from the spirit and scope of the invention. It is, therefore, contemplated that the appended claims will cover such modifications that fall within the true scope of the invention.

What is claimed is:

1. A chip packaging configuration for preventing differential electrical coupling with a plurality of associated bit lines, comprising:
    an integrated circuit chip having a lead frame electrically coupled with said plurality of associated bit lines, said plurality of associated bit lines being near a surface of said integrated circuit chip;
    a first packaging material having a first dielectric constant covering a first portion of said surface and associated between said plurality of associated bit lines and said lead frame;
    a second packaging material having a second dielectric constant covering a second portion of said surface and associated between said plurality of bit lines and said lead frame;
    said first packaging material and said second packaging material associated with said plurality of associated bit lines to expose each of said plurality of bit lines to allow approximately equal coupling to said lead frame for each bit line through said first dielectric constant and said second dielectric constant to thereby prevent differential electrical coupling of said plurality of associated bit lines with said lead frame.

2. The configuration of claim 1, wherein said first packaging material comprises a polyimide tape.

3. The configuration of claim 2, wherein said first dielectric constant is approximately 3.5.

4. The apparatus of claim 1, wherein said second packaging material comprises a molding compound and said second dielectric constant is approximately 5.0.

5. The apparatus of claim 1, wherein said first packaging material and said second packaging material associate to form a vertical boundary having a zig-zag pattern.

6. The configuration of claim 1, wherein said first packaging material and said second packaging material associate to form a vertical boundary having a sinusoidal pattern over said plurality of associated bit lines.

7. A method for preventing differential electrical coupling of a plurality of associated bits with a chip packaging configuration, comprising the steps of:
    electrically coupling a lead frame with a plurality of associated bit lines of an integrated circuit chip, said plurality of associated bit lines being near a surface of said integrated circuit chip;
    covering a first portion of said surface with a first packaging material having a first dielectric constant and positioning said first packaging material between said plurality of associated bit lines and said lead frame;
    covering a second portion of said surface with a second packaging material having a second dielectric constant and positioning said second packaging material between said plurality of associated bit lines and said lead frame;
    associating said first packaging material and said packaging material with said plurality of associated bit lines to expose each of said plurality of bit lines to allow approximately equal coupling to said lead frame for each bit line through said first dielectric constant and said second dielectric constant to there by prevent differential coupling of said plurality of associated bit lines with said lead frame.

8. The method of claim 7, further comprising the step of forming said first packaging material of a polyimide tape so that said first dielectric constant approximates 3.5.

9. The method of claim 7, further comprising the step of forming said second packaging material from a molding compound so that said dielectric constant approximates 5.0.

10. The method of claim 8, further comprising the step of associating said first packaging material and said second packaging material to form a vertical boundary in a zig-zag pattern over said plurality of associated bit lines.

11. The method of claim 8, further comprising the step of associating said first packaging material and said second packaging material to form a vertical boundary having a sinusoidal pattern over said plurality of associated bit lines.

* * * * *